(12) United States Patent
Morimoto et al.

(10) Patent No.: US 6,750,132 B2
(45) Date of Patent: Jun. 15, 2004

(54) FLIP CHIP PACKAGE, CIRCUIT BOARD THEREOF AND PACKAGING METHOD THEREOF

(75) Inventors: Kenji Morimoto, Saijo (JP); Hiroshi Ochi, Saijo (JP)

(73) Assignee: Matsushita Electric Industrial Co., Ltd. (JP)

( * ) Notice: Subject to any disclaimer, the term of this patent is extended or adjusted under 35 U.S.C. 154(b) by 35 days.

(21) Appl. No.: 10/088,479

(22) PCT Filed: Jul. 18, 2001

(86) PCT No.: PCT/JP01/06230

§ 371 (c)(1),
(2), (4) Date: Mar. 20, 2002

(87) PCT Pub. No.: WO02/09485

PCT Pub. Date: Jan. 31, 2002

(65) Prior Publication Data

US 2002/0175407 A1 Nov. 28, 2002

(30) Foreign Application Priority Data

Jul. 21, 2000 (JP) .......................... 2000-219911

(51) Int. Cl.⁷ .................. H01L 21/44; H01L 31/00; H01L 23/48
(52) U.S. Cl. .................. 438/612; 438/613; 438/108; 257/778; 257/459; 257/737; 257/738
(58) Field of Search .................. 438/612, 613, 438/108; 257/778, 459, 738, 737

(56) References Cited

U.S. PATENT DOCUMENTS

| | | | | |
|---|---|---|---|---|
| 5,049,480 A | | 9/1991 | Nebe et al. ................. 430/281 |
| 5,338,391 A | | 8/1994 | Suppelsa et al. ............ 158/630 |
| 5,508,228 A | * | 4/1996 | Nolan et al. ................. 438/614 |
| 5,869,904 A | * | 2/1999 | Shoji ........................... 257/779 |
| 5,903,056 A | * | 5/1999 | Canning et al. ............ 257/773 |
| 6,331,736 B1 | * | 12/2001 | Duesman et al. ........... 257/778 |

FOREIGN PATENT DOCUMENTS

| | | |
|---|---|---|
| EP | 0 657 932 | 12/1994 |
| JP | 6-66355 | 8/1994 |
| JP | 07231050 A | 8/1995 |
| JP | 08078476 A | 3/1996 |
| JP | 08-222840 | 8/1996 |
| JP | 11-121527 | 4/1999 |
| JP | 2001144143 A | 5/2001 |
| JP | 2001267366 A | 9/2001 |

* cited by examiner

Primary Examiner—David E. Graybill
Assistant Examiner—James M. Mitchell
(74) Attorney, Agent, or Firm—Parkhurst & Wendel, L.L.P.

(57) ABSTRACT

According to the present invention, when a semiconductor element having protruding electrodes formed thereon is connected to a circuit board via conductive resin, stable connection is made even when an electrode pitch is small on the semiconductor element. On semiconductor element package regions on the circuit board, a paste electrode material containing photopolymerizable materials is printed to form a film having a prescribed thickness, and this electrode material film is baked after exposure and development thereof so as to obtain circuit electrodes having edges warped in a direction of going apart from the circuit board surface. Then, the protruding electrodes and the concave surfaces of the circuit electrodes are brought in abutment with each other and connected via the conductive resin which surrounds the abutments between the respective electrodes and is held on the concave surfaces of the circuit electrodes. With this arrangement, the concave surfaces of the circuit electrodes act as saucers and prevent the conductive resin from being squeezed out, thereby eliminating possible occurrence of short circuits.

3 Claims, 3 Drawing Sheets

FLIP CHIP PACKAGE, CIRCUIT BOARD THEREOF AND PACKAGING METHOD THEREOF

TECHNICAL FIELD

The present invention relates to a flip chip package, a circuit board thereof and a packaging method thereof, and specifically to a flip chip package having an electrode structure suitable for a flip chip package, a circuit board thereof and a packaging method thereof.

BACKGROUND ART

An electronic circuit has been recently higher in density, and the need for a smaller area and connecting resistance has been intensified regarding a packaged device. One of means for attaining a high-density package is flip chip package. Several kinds of packaging methods are available for the flip chip package, and in consideration of easy repair and unleading, which has attracted attention in recent years, SBB method (Stud Bump Bonding) is a desirable technique. The SBB method is a technique for forming protruding electrodes, which are made of materials such as Au, on a semiconductor element by a wire bonding method and for connecting the protruding electrodes and electrodes on a circuit board via conductive resin.

Referring to FIG. 3, a paste electrode material is firstly printed on a circuit board 11 by a method such as screen printing, and the circuit board 11 is baked at a temperature of sintering the electrode material. Thus, circuit electrodes 12 are formed on the circuit board 11. On the other hand, protruding electrodes 14 are formed on a semiconductor element 13 by a method such as wire bonding, and a layer of conductive resin 15 is formed on the protruding electrodes 14 by transferring and so on. Thereafter, the circuit board 11 and the semiconductor element 13 are positioned high accurately and a suitable load is applied thereon. Hence, the semiconductor element 13 is packaged on the circuit board 11.

However, the above conventional packaging method is disadvantageous as in the following. First, since the semiconductor element 13 has decreased in electrode pitch in recent years, an electrode pitch on the circuit board 11 needs to be smaller accordingly. However, according to the conventional screen printing method, a pitch is limited up to 300 $\mu$m and printing is difficult with a pitch below the limit, causing frequent short circuits and breaks in a wire. Consequently, the yields are lowered.

Secondly, when the semiconductor element 13 is smaller in electrode pitch, it is quite difficult to control a quantity of the conductive resin 15 transferred onto the protruding electrodes 14 of the semiconductor element 13. Particularly, short circuits are more likely to occur. In order to prevent the short circuits, a quantity of the conductive resin 15 is set smaller than that of the conventional art. However, since the electrode material expands laterally, the circuit electrodes 12 are each half-round in cross section when an electrode pitch is 100 $\mu$m. In the case where flip-chip packaging is carried out on the circuit electrodes 12, the conductive resin 15 is squeezed out of the circuit electrodes 12 as shown in FIG. 3. Therefore, the conductive resin 15, which is squeezed out of the adjacent circuit electrodes 12, may be short-circuited.

DISCLOSURE OF INVENTION

The object of the present invention is to make a stable connection with a circuit board even when a semiconductor element has a small electrode pitch.

In order to solve the foregoing problem, when protruding electrodes formed on the semiconductor element are connected to circuit electrodes on the circuit board via conductive resin, the present invention comprises the steps:

(a) forming an electrode material film having a prescribed dry film thickness by using a paste electrode material containing a photopolymerizable material;
(b) exposing and developing the electrode material film;
(c) baking the developed electrode material film; and
(d) flip-chip packaging the semiconductor element on the circuit electrodes formed in the above steps.

In the above steps, concave circuit electrodes having warped edges are formed on the circuit board. Since the concave surfaces of the circuit electrodes act as saucers, it is possible to flip-chip package the semiconductor element without squeezing out any conductive resin. Consequently, it is possible to eliminate the occurrence of short circuits, achieving a reliable packaging for the semiconductor element.

Ceramic is applicable as the circuit board. The circuit board, can be provided not only with a circuit including circuit electrodes for mounting the above semiconductor element, but also a circuit for mounting components other than the semiconductor element as well as a circuit for making connection with another board.

Such an electrode material is used that contains, at least, metallic materials such as Au, Ag, or Cu and glass as inorganic components, and a monomer and a polymer which also serve as polymeric materials and a photoinitiator as organic components. Ni or Au plating may be applied to the surface of the formed circuit electrodes.

Such a semiconductor element is used that is formed with the protruding electrodes made of metallic materials such as Au, Al, Cu, and solder. Any method including wire bonding and plating is applicable for forming the protruding electrodes.

The conductive resin is applicable as long as the resin contains conductive components such as Au, Ag, and Cu to connect the protruding electrodes on the semiconductor element and the circuit electrodes on the circuit board. Any type of resin is applicable regardless of whether it is thermosetting or thermoplastic.

In the above step (a), a film is formed by printing a paste electrode material on the circuit board. The electrode material needs to be printed only on a package region for packaging the semiconductor element. The other regions may be formed with a circuit pattern in advance according to the above mentioned conventional method. In addition, upon printing, which is not intended for forming a circuit pattern, printing may be performed over, the entire surface of the package region. Thus, a rough printing such as a conventional screen printing is sufficiently applicable. The electrode materials is dried at a suitable temperature to prevent the material from flowing after printing. However, a printing plate and printing conditions need be set so as to secure a prescribed film thickness, which is preferably 10 to 20 ($\mu$m).

In step (b), a glass mask and so on are positioned on the circuit board, on which the electrode material is printed and dried. The glass mask is formed, such that only an electrode region having the semiconductor element transmits light. Ultraviolet rays having a wavelength of 320 to 370 nm are radiated at 300 to 500 mJ. Thereby, polymeric materials on an electrode region which transmits ultraviolet rays are started by a photoinitiator to react and polymerized. After some appropriate time, the board is entirely developed by means of a solution for dissolving a polymeric material which has not reacted. Thus, the film is removed from other parts than the electrode regions and remains on the electrode regions. At this time, by adjusting the film thickness, polymeric materials receiving less light are left to remain insufficiently polymerized toward the board. Upon development, erosion is started from non-electrode regions from which the film has been removed, further to wider area toward the board. As a result, the film has a trapezoidal cross section on the electrode region. When a film thickness is small, all the polymeric materials are polymerized and it is impossible to obtain a film having a trapezoidal cross section. Therefore, the above film thickness is demanded.

In step (c), the circuit board completed with exposure and development is baked at a temperature for sintering the electrode material, and the circuit electrodes are baked onto the circuit board. At this time, the electrode material film is caused to slightly shrink, so that both ends of the formed circuit electrode are slightly warped (such warped part is called an edge curl) and the cross section of the circuit electrode becomes arc-shaped. Plating of Ni, Au and so on may be applied in order to protect the electrode surfaces after baking.

In step (d), the semiconductor element having the protruding electrodes formed thereon is flip-chip packaged on the circuit board by using the conductive resin. At this time, the edge curl of the circuit electrode acts as a wall, thereby, preventing the conductive resin from being squeezed out.

BEST MODE FOR CARRYING OUT THE INVENTION

The present invention is characterized in that when a semiconductor element is flip-chip packaged on a circuit board by using a conductive resin, the element having protruding electrodes formed thereon, an electrode material containing photopolymerizable materials is printed on a semiconductor element package region on the circuit board such that a film is formed with a prescribed thickness, concave circuit electrodes are formed by baking the electrode material film after exposure and development are performed so as to allow the electrode material film to remain only on prescribed electrode regions, the concave circuit electrode having edges warped in a direction of going apart from a board surface, the protruding electrodes formed on the semiconductor element are brought into contact with the concave sides of the concave circuit electrodes, and the protruding electrodes and the circuit electrodes are connected with each other via the conductive resin.

Further, the present invention is characterized by forming the electrode material film with a dry film thickness of 10 to 20 micrometers by using a flip-chip packaging method.

Moreover, the present invention is characterized in that the electrode material film remaining after development is trapezoidal in cross section that is wider as it goes farther from the circuit board.

Also, the present invention is characterized in that the circuit electrode is arc-shaped in cross section according to the flip-chip packaging method.

Besides, according to the present invention, a flip-chip package, in which the semiconductor element having the protruding electrodes formed thereon is packaged on the circuit board by using the conductive resin, is characterized in that the circuit board includes the concave circuit, electrodes each having edges warped in a direction of going apart from the board surface, the semiconductor element is disposed such that the ends of the protruding electrodes are in contact with the concave surfaces of the concave circuit electrodes, and the protruding electrodes and the circuit electrodes are, connected to each other via the conductive resin.

Furthermore, according to the present invention, the circuit board for flip-chip packaging the semiconductor element, which has the protruding electrodes formed thereon, by using the conductive resin, is characterized by including the concave circuit electrodes each having edges warped in a direction of going apart from the board surface.

Referring to drawings, the embodiments of the present invention will be discussed in a specific manner.

Figure 1:
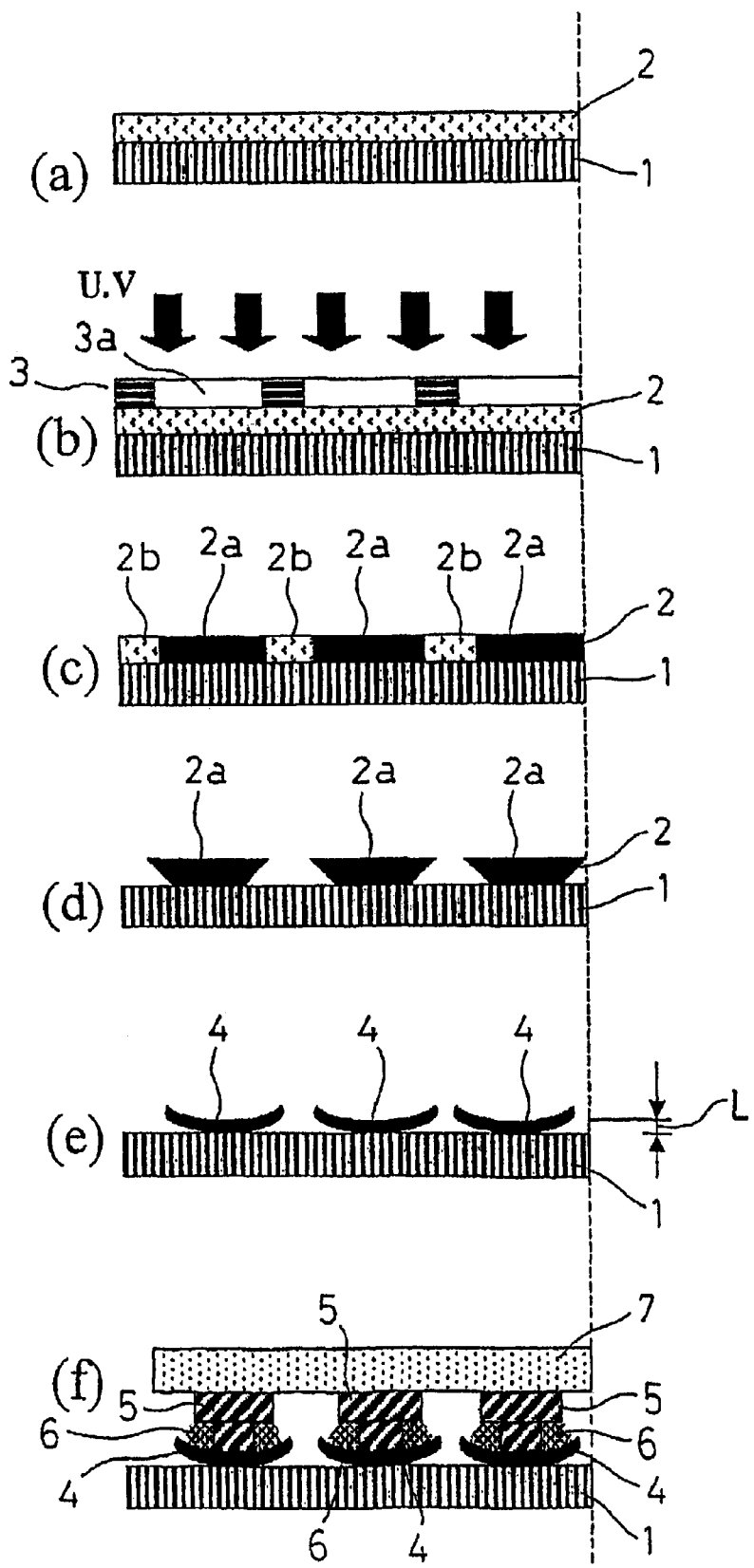
FIG. 1 is a process sectional view explaining a method of flip-chip packaging a semiconductor element according to Embodiment 1 of the present invention.

FIG. 1 is a process sectional view explaining a method of packaging a semiconductor element according, to Embodiment 1 of the present invention.

As shown in FIG. 1(a), a paste electrode material 2 containing photopolymerizable materials is printed on an area for placing a semiconductor element on a circuit boards 1. After printing, the electrode material 2 is dried at a suitable temperature without flowing. At this moment, the electrode material 2 is printed while sprinting type and conditions are determined so as, to have a film thickness of 10 to 20 $\mu$m after drying.

Then, as shown in FIG. 1(b), a glass mask 3 is disposed on the film of the electrode material 2 while being positioned on the circuit board 1. Openings 3a are formed on the glass mask 3 to transmit light through a desired circuit pattern. To be specific, the 50 $\mu$m-width openings 3a corresponding to electrode regions are formed with a 100 $\mu$m-pitch. Then, UV (ultraviolet ray), having a wavelength of 320 to 370 nm is radiated at 300 to 500 mJ from the above of the glass mask 3.

As shown in FIG. 1(c), due to UV passing through the openings 3a, photopolymerizable materials of the electrode material 2 on the electrode regions 2a, i.e., a photoinitiator, a monomer, and a polymer are reacted with one another to proceed polymerization. In contrast, regarding photopolymerizable materials of the electrode material 2 on non-electrode regions 2b, polymerization does not occur. Since UV is not likely to enter the neighborhood of the circuit board 1, the electrode materials 2 are not likely to be polymerized on these regions.

Subsequently, the electrode material 2 is developed by using an alkaline solution and so on. Thus, it is possible to dissolve and remove the electrode material 2 on the non-electrode regions 2b having no polymerization or insufficient polymerization. As shown in FIG. 1(d), this operation removes the electrode material 2 on the non-electrode regions 2b. In the vicinity of the surface of the electrode material 2 on the electrode regions 2a, polymerization is proceeded completely. Hence, the electrode material 2 remains without any erosion so as to correspond in shape to the openings 3a of the glass mask 3. Meanwhile, regarding the electrode material 2 around the circuit board 1, polymerization is not completed over a wide region as compared with the neighborhood of the surface, resulting in erosion larger than the openings 3a. Consequently, the electrode material 2 on the electrode region 2a is trapezoidal in cross section.

Thereafter, since the circuit board 1 is baked at a temperature of sintering the electrode material 2 as shown in FIG. 1(e), the electrode material 2 on the circuit board 1 is baked as circuit electrodes 4. According to FIG. 1(e), since the electrode material 2 contracts upon baking, the edges of the circuit electrodes 4 are warped in a direction of going apart from the circuit boards (edge curl), and the circuit electrodes 4 are arc-shaped depressions in cross section.

Finally, as shown in FIG. 1(f), the semiconductor element 7, on which conductive resin 6 is transferred to protruding electrodes 5, is accurately positioned to the circuit substrate 1 such that the protruding electrodes 5 and the circuit electrodes 4 are opposed to each other. A suitable load is applied to the semiconductor element 7, the protruding electrodes 5 and the circuit electrodes 4 are brought into contact with each other, and the conductive resin 6 is cured. Hence, the flip chip packaging of the semiconductor element 7 is completed.

In the flip chip package manufactured in the above manner, the edge-curled circuit electrodes 4 prevent the conductive resin 6 from being squeezed out of the circuit electrodes 4. Therefore, at the time of packaging the semiconductor element 7 with a 100-$\mu$m electrode pitch, the conductive resin 6 expanding laterally does not cause any short circuits between the adjacent electrodes.

Now, the circuit electrodes 4 will be further discussed.

As shown in FIG. 1(e), a maximum distance from the surface of the circuit board 1 to the edge-curled circuit electrodes 4 is defined as an edge curl amount L (see FIG. 1(e)). An edge curl amount L is considerably dependent upon a dry film thickness of the electrode material 2 shown in FIG. 1(a). When a dry film thickness is 10 to 20 $\mu$m, an edge curl amount L is 2 to 10 $\mu$m. Thus, the circuit electrodes 4 can act as saucers.

Meanwhile, when a dry film thickness is larger than 20 $\mu$m, parts not being polymerized on the circuit board 1 are larger in thickness, and the electrode material 2 to be developed and removed on the circuit board 1 remains resulting in short circuits. In contrast, when a dry film thickness is 10 $\mu$m or less, an edge curl amount L is 2 $\mu$m or less and the circuit electrodes 4 cannot sufficiently, act as saucers.

Figure 2:
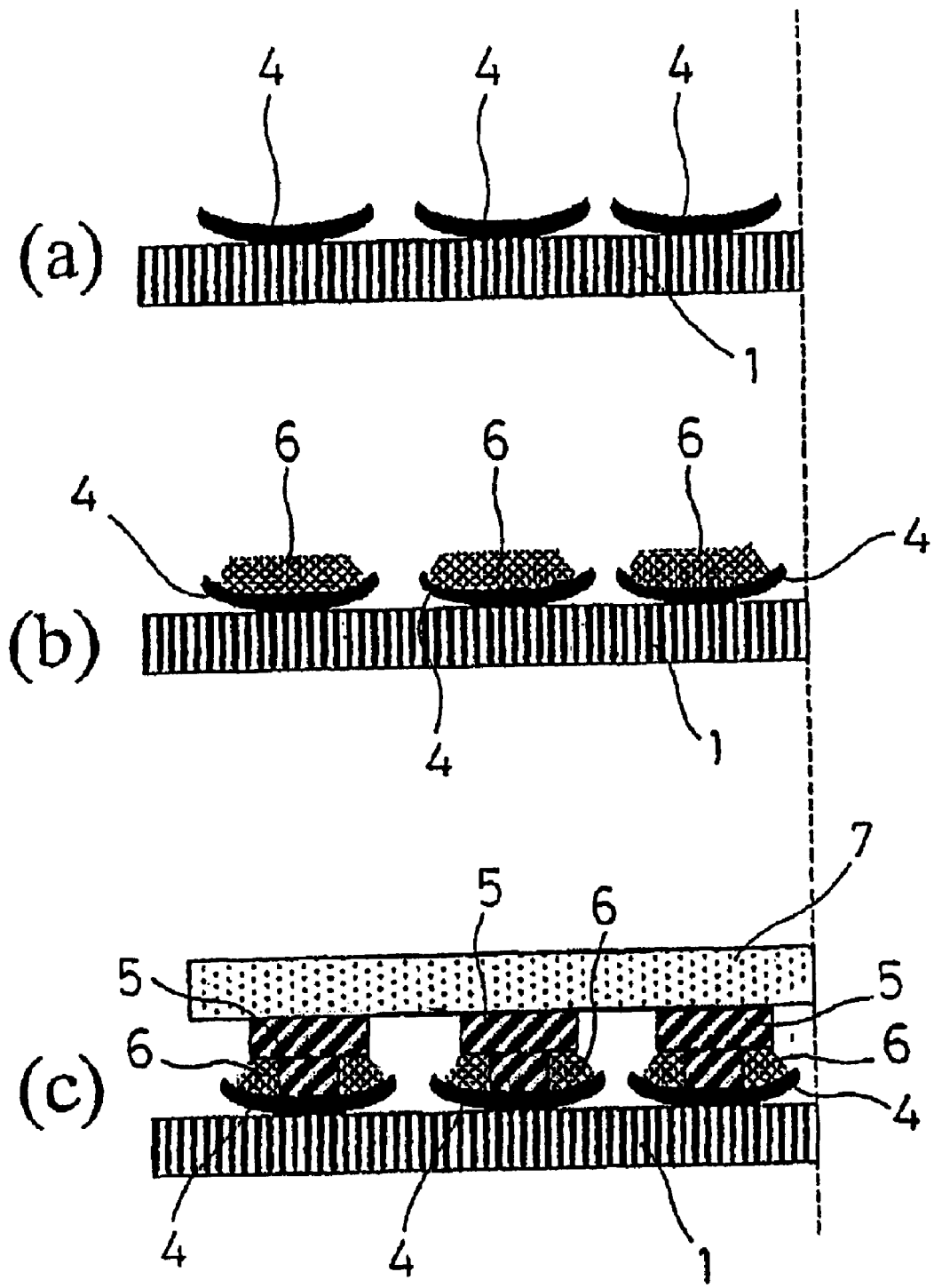
FIG. 2 is a process sectional view explaining a method of flip-chip packaging a semiconductor element according to Embodiment 2 of the present invention.
Figure 3:
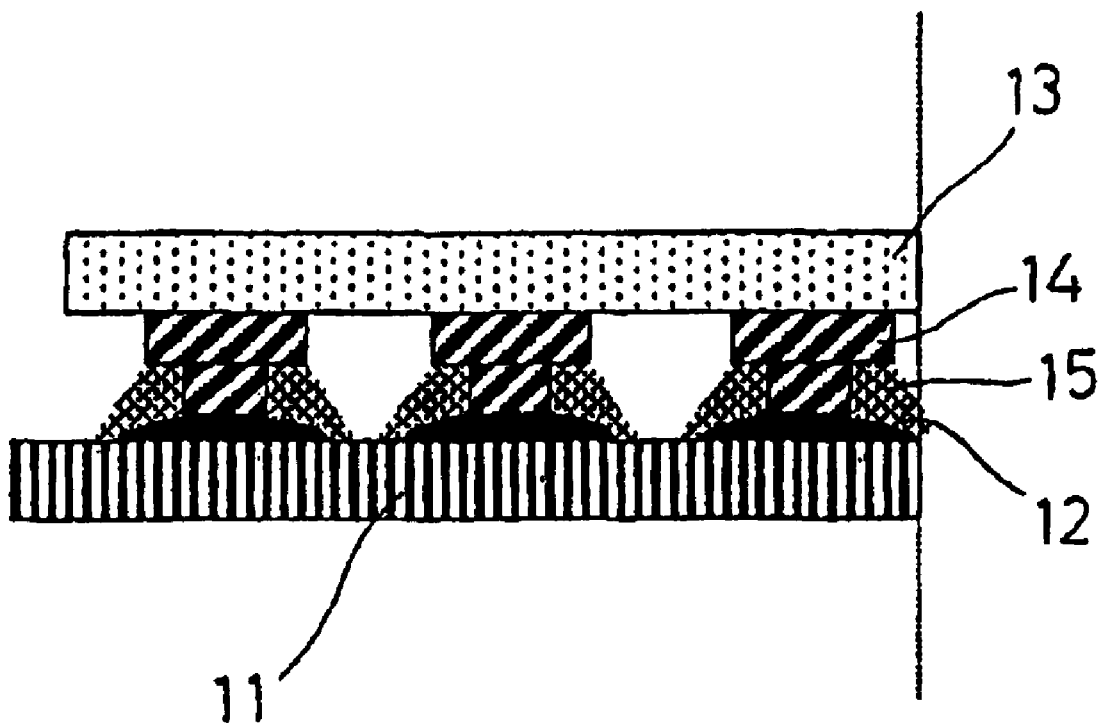
FIG. 3 is a process sectional view explaining a conventional method of flip-chip packaging the semiconductor element.

FIG. 2 is a process sectional view explaining a method of packaging a semiconductor element according to Embodiment 2 of the present invention.

As shown in FIG. 2(a), like Embodiment 1, edge-curled circuit electrodes 4 are formed on a circuit substrate 1. And then a mask (not shown) having openings corresponding to the circuit electrodes 4 is positioned onto the circuit electrodes 4, and conductive resin 6 is applied to the circuit electrodes 4 as shown in FIG. 2(b) by using a printing method and so on. Thereafter, as shown in FIG. 2(c), a semiconductor element 7 having protruding electrodes 5 formed thereon is positioned to the circuit board 1, and a suitable load is applied onto the semiconductor element 7. Hence, the flip chip packaging of the semiconductor element 7 is completed.

According to such a method as well, like Embodiment 1, the edge-curled circuit electrodes 4 act as saucers to prevent the conductive resin 6 from being squeezed out, thereby eliminating the occurrence of short circuits.

EXPERIMENTAL EXAMPLE

A semiconductor element is packaged according to the above manufacturing steps and the performance is evaluated. Used members and materials are:

circuit board: low-temperature baked ceramic multilayered board (test pattern)
   board size: 30×30×0.65 (mm)
   electrode pitch: 100 ($\mu$m)
   number of electrodes: 360 pins The electrode material 2 contains Ag as a metallic component with a dry film thickness of about 15 $\mu$m. And then, the electrode material film is exposed and developed using a glass mask having openings formed thereon. The openings are each about 50 $\mu$m in width. The electrode material 2 on the non-electrode regions 2b having no or insufficient polymerization is dissolved and removed. The circuit board 1, on which the electrode material 2 on the non-electrode regions 2b is dissolved and removed, is baked at about 800 to 1000° C. Hence, the electrode material 2 on the circuit board 1 is baked as circuit electrodes 4. At this moment, an edge curl amount L is 4 $\mu$m. Ni plating and Au plating are applied to protect the surface.

IC: Dummy IC
   IC size 10×10×0.5 (mm)
   IC electrode pad pitch: 100 ($\mu$m)
   Number of pins: 360 pins The protruding electrodes 5 are formed on the electrodes of the above IC by using metallic wires, and the conductive resin 6 is transferred onto the formed protruding electrodes 5. The conductive resin 6 contains Ag as a metallic component and epoxy as a resin component. The IC including the conductive resin 6 is positioned onto the circuit board 1 and a weight of several grams is applied to each of the protruding electrodes so as to complete packaging. And then, after curing the conductive resin 6 by heating, evaluation is made on short/open. FIG. 1 shows the result.

TABLE 1

| | | |
|---|---|---|
| Method of Present Invention | Open | 0/5 Package |
| | Short | 0/5 Package |
| Conventional Method | Open | 0/5 Package |
| | Short | 4/5 Package |

As understood from Table 1, the method of the present invention does not cause any opens or short circuits at all. Meanwhile, the conventional method causes short circuits on a 4/5 package. Thus, the effectiveness of the present invention can be confirmed.

As described above, according to the present invention, the edge-curled circuit electrodes are formed on the circuit board, and the protruding electrodes of the semiconductor element are connected to the circuit electrodes by using the conductive resin. Hence, it is possible to prevent the conductive resin from being squeezed out while the circuit electrodes act as saucers, achieving a reliable packaging for the semiconductor element without any occurrence of short circuits.

What is claimed is:

1. A flip-chip packaging method for attaching a semiconductor element to a circuit board with conductive resin, said element having protruding electrodes thereon, the method comprising:

printing an electrode material containing photopolymerizable materials on a semiconductor element package region on said circuit board such that a film is formed with a prescribed thickness, and allowing said electrode material film to remain only on prescribed electrode areas, said remaining electrode material film, after having been exposed and developed, resulting in remaining areas of said electrode material film whose thickness in cross section is trapezoidal and widens in an outward direction from an interface of said remaining areas with the circuit board;

baking said trapezoidal electrode material remaining areas to form concave circuit electrodes having edges warped in a direction away from the circuit board surface; and bringing said protruding electrodes formed on said semiconductor element into abutment with concave faces of said concave circuit electrodes, and connecting said protruding electrodes and said circuit electrodes with each other via the conductive resin.

2. The flip-chip packaging method according to claim 1, wherein said electrode material film has a dry film thickness of 10 to 20 micrometers.

3. The flip-chip packaging method according to claim 1, wherein said circuit electrode is arc-shaped in cross section.

* * * * *